United States Patent
Johnson et al.

(10) Patent No.: US 6,800,913 B2
(45) Date of Patent: Oct. 5, 2004

(54) HYBRID HALL VECTOR MAGNETOMETER

(75) Inventors: Mark B. Johnson, Springfield, VA (US); Michael Miller, Alexandria, VA (US); Brian Bennett, Arlington, VA (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 10 days.

(21) Appl. No.: 10/287,876

(22) Filed: Nov. 4, 2002

(65) Prior Publication Data

US 2004/0085065 A1 May 6, 2004

(51) Int. Cl.[7] .................. H01L 29/82; G01R 33/02; G01R 33/07

(52) U.S. Cl. .................. 257/421; 324/244; 324/251

(58) Field of Search .................. 324/244, 244.1, 324/251; 257/414, 421, 425, 427

(56) References Cited

U.S. PATENT DOCUMENTS 6,683,359 B2 * 1/2004 Johnson et al. ............. 257/421

* cited by examiner

*Primary Examiner*—Bot LeDynh
(74) *Attorney, Agent, or Firm*—John J. Karasek; John Gladstone Mills, III

(57) ABSTRACT

A modified hybrid Hall effect device is provided which is the combination of a conventional Hall effect device and a second Hall effect device having a Hall plate coupled to a ferromagnetic layer. The hybrid Hall effect device can be used to determine the independent magnetic field vector components comprising a vector magnetic field, such as for determining the $\hat{x}$ and the $\hat{z}$ components of a magnetic field, or for measuring the total magnitude of a vector magnetic field of any orientation. The modified Hall Effect device can be adapted for use as a magnetic field sensor for the detection of macroscopic objects that have associated magnetic fields, or for microscopic objects that have been tagged by microscopic magnetic particles. In one specific form, a plurality of hybrid Hall devices are electrically connected together to form an array in which a plurality of rows of hybrid Hall devices are electrically coupled to each other along a current axis, and the array is used for the detection of microscopic objects.

18 Claims, 14 Drawing Sheets

HYBRID HALL VECTOR MAGNETOMETER

FIELD OF THE INVENTION

The present invention relates generally to a Hall Effect device, and, in particular, to a modified Hall effect device which is a hybrid combination of a first conventional Hall plate and a second conventional Hall plate coupled to a ferromagnetic layer.

BACKGROUND OF THE INVENTION

Several different types of devices are available for the measurement of magnetic fields. Examples that operate at room temperature include flux gate magnetometers and magnetoresistors. A third family of devices is one of the oldest commercial field sensors, the Hall plate. All of these devices share a common trait; they measure a scalar value of magnetic field that represents a single component of the vector field to be measured. The family of Hall devices includes dozens, if not hundreds, of variations, for example, R. S. Popovic, "Hall-effect Devices," Sens. Actuators 17, 39 (1989); and R. S. Popovic, "Hall Effect Devices", (Adam Hilger, Bristol, 1991), both herein incorporated by reference. One limitation of all of these Hall devices is that these devices only can measure a scalar field value proportional to the component of vector field that is perpendicular to the plane of the Hall plate.

In the art, one-dimensional arrays of Hall devices have been used to achieve a moderate magnetic field spatial resolution. A one-dimensional array of Hall crosses has been described by E. Zeldov et al., "Thermodynamic observation of first-order vortex-lattice melting transition in BiSrCaCuO," Nature 375, 373 (1995), herein incorporated by reference. In this study, an array of ten Hall crosses, with dimensions of 3 $\mu$m by 3 $\mu$m for each sensor, was used to detect the motion of fluxons in a small sample of single crystal superconducting BiSrCaCuO. The sensors were fabricated on a GaAs/AlGaAs chip and a macroscopic (0.7 mm by 0.3 mm by 0.1 mm) sample was placed on top. Each Hall sensor had a DC sensitivity of order 0.1 Oe and each was able to sense the presence of a single fluxon when in proximity to the sensor. The spatial resolution of the measurement was therefore of the order of magnitude of the Hall sensor dimensions, a few microns.

One recent advancement in the art of measuring magnetic fields is provided by a hybrid Hall effect device. A hybrid Hall device is a simple bilayer magnetoelectronic device. The physical principles of operation are described in the publication "Hybrid Hall Effect Device," by Mark Johnson, B. Bennett, M. J. Yang, M. M. Miller and B. V. Shanabrook, Appl. Phys. Lett. 71, (1997) and in U.S. Pat. No. 5,652,445 entitled "Hybrid Hall Effect Device and Method of Operating," both herein incorporated by reference, and are briefly described below with reference to FIGS. 1(a) and (b).

An example of one prior art hybrid Hall effect device is generally denoted 10 in FIGS. 1(a) and 1(b). A thin, microstructured ferromagnetic film F, denoted 11, is fabricated over a standard Hall cross 12 formed from a Hall plate 14, and positioned such that edge 13 of film 11 is disposed over the central region of the Hall cross 12. The film 11 is electrically isolated from the Hall cross 12, typically by a thin insulating layer 15.

The film 11 has a magnetization anisotropy in the film plane and acts as a local source of magnetic field. When an external magnetic field $H_x\hat{x}$ causes the magnetization M of F to be along $-\hat{x}$, there is a positive magnetic pole density on the edge over the Hall cross 12, and a local negative field $-|B_z|$ is generated in the vicinity of the carriers in the Hall plate 14 which comprises an InAs layer 16, a second insulating layer 17 and a substrate 18 (see FIG. 1(b)). The result is a positive sense voltage $V_s=V_+-V_-$. If the magnetization orientation is reversed, the sign of the pole density, the local field $|B_z|$, and the sense voltage $V_s$ is reversed. Thus, device 10 translates a horizontal magnetic field into a vertical magnetic field, thereby providing for the detection and measurement of the convolution of the $\hat{x}$ and $\hat{z}$ field components comprising the magnetic field.

When fabricated with appropriate magnetic properties, the film 11 has bistable magnetization and the resulting hybrid Hall effect device 10 has digital applications, such as nonvolatile storage. When fabricated with other magnetic properties, the magnetization of film 11 responds linearly with an external field. A hybrid Hall effect device engineered in this way can act as a sensor of in-plane magnetic fields.

One limitation with prior art hybrid Hall effect devices, such as device 10, is that these prior art devices cannot be used to determine the independent magnetic field vector components comprising a vector magnetic field, such as for determining the $\hat{x}$ and the $\hat{z}$ components of a magnetic field; device 10 merely measures the convolution of the $\hat{x}$ and $\hat{z}$ field components.

BRIEF SUMMARY OF THE INVENTION

The present invention concerns a modified hybrid Hall effect device, which is a hybrid combination of a first conventional Hall plate and a second conventional Hall plate coupled to a ferromagnetic layer, corresponding to film F. The modified Hall Effect device can be adapted for use as a magnetic field sensor capable of measuring the individual components of a vector magnetic field. Equivalently, the device is capable of measuring the magnitude of a vector magnetic field of any orientation.

In the present modified hybrid Hall effect device, the ferromagnetic film acts as a field transducer that translates a horizontal field into a vertical field. This is a function that can be combined with the sensitivity of Hall devices for use in applications where perpendicular and horizontal magnetic field components are present, to make a magnetometer that is sensitive to more than a single component of the field.

An object of the present invention is to provide an inexpensive, integrated combination of a Hall device that is adaptable for measuring two or three components of a vector magnetic field, $\overline{B}$. A magnetometer, incorporating the present invention, which is capable of measuring two or more vector components of a magnetic field, has several advantages over magnetometers which are capable only of scalar measurements. The single component to which a scalar magnetometer is sensitive may be the smallest component of the vector field to be measured. Therefore, measuring all three vector components, the vector magnetometer always measures the total field magnitude, and is therefore intrinsically more sensitive in any application.

An additional object of the present invention is to provide a microfabricated magnetometer cell with two or three components for measuring a vector field with high spatial resolution. A specific application is the calibration and characterization of magnetic force microscope (MFM) tips. A cell that measures a single component of field can also be used for this application, with diminished field sensitivity by comparison with the two or three component cells.

A further object of the present invention is to provide a device, which is adaptable to use any source of magnetic field and which generates a three-dimensional magnetic field that is dipolar but has properties unique to that source. The source may be either a macroscopic source, such as a vehicle, or a microscopic source such as a magnetic particle used to tag a molecule or bundle of molecules. While measuring a scalar field might permit the detection of a source of the field, measuring a vector field permits the detection of a source and, with a suitable model, also permits the identification of the object that is the source. Following this functionality, measurement of a vector field as a function of time and/or position permits an analysis of position and motion of the object, which is the field source.

An additional object of the present invention is to provide an inexpensive vector magnetometer adaptable for use in remotely sensing large objects that have intrinsic magnetic moments.

Yet another object of the present invention is to provide a microfabricated vector magnetometer with high spatial resolution that can be adapted to scan across a magnetic field that includes an object of interest.

A further object of the present invention is to provide novel techniques for forming two-dimensional arrays of Hall cells, and new applications employing arrays of Hall devices for sensing magnetic fields with high spatial resolution.

Another object of the present invention is to provide a two-dimensional array of sensor cells for high spatial resolution of objects that have local magnetic fields that vary on a small spatial scale.

Yet a further object of the present invention is to provide a sensor cell that can be adapted for use as a susceptometer, to detect one, two or three components of magnetic field when a perturbing magnetic field is applied to an object.

A further object of the present invention is to provide susceptometers for use in applications where an external perturbing magnetic field is applied to the object that is the source of magnetic field to be measured, even if the perturbing field is also applied to the sensor.

In accordance with the aforementioned objects, the present invention concerns an integrated Hall effect device for measuring the vector components of an external magnetic field. The device includes a conductive substrate having a top surface with a first section and a second section and is capable of carrying an electrical current. The first section is positioned in close proximity to the second section such that a first electrical signal can be generated in response to one of the vector components of the external magnetic field acting perpendicularly on the electrical current in the conductive substrate. A ferromagnetic film is provided having at least one configurable magnetization orientation state and the ferromagnetic film is disposed over a portion of the second section such that a fringe magnetic field can be generated from an edge of the ferromagnetic film by vector components of the external magnetic field acting on the magnetic film wherein a second electrical signal can be generated in response to the fringe magnetic field acting on an external current in the conductor substrate. In one further specific form, the conductive substrate and the ferromagnetic film are separated by an insulating layer.

According to another aspect of the present invention, a method is provided for calibrating a magnetic force microscope (MFM) tip by measuring vector components of a magnetic field generated by the microscope tip. The method includes the steps of generating an electrical current that flows along a current axis of a conductor substrate, scanning the microscope tip across the conductor substrate at a variable height, and generating a first electrical signal along a first voltage axis in response to a vector component of a magnetic field from the microscope tip acting on the electrical current in the conductor substrate. The values of the first electrical signal are mapped as a function of the variable height.

In one specific further embodiment, the microscope tip is scanned across a ferromagnetic film disposed over a portion of the second section at a variable height and a corresponding fringe field is generated at an edge of the ferromagnetic film in response to vector components of a magnetic field from the microscope tip acting on the ferromagnetic film. The edge of the ferromagnetic film is located adjacent to a second voltage axis such that the corresponding fringe field is perpendicular to the current axis. A second electrical field is generated along the second voltage axis in response to the fringe field acting on the electrical current in the connected substrate. The values of the first electrical signal and the second electrical signal are mapped as a function of the variable height.

In accordance with another aspect of the present invention, a method is provided for identifying chemical or biological agents that have been tagged with microscopic magnetic particles by measuring vector components of a magnetic field generated by the magnetic particles. The method includes generating an electrical current that flows along a current axis of a conducting substrate mounted on a proximal probe tip. The substrate is scanned for chemical or biological agents and a first electrical signal along a first voltage axis is generated in response to vector components of a particle's magnetic field acting on the electrical current in the conductive substrate. The first electrical signal is recorded and values of the first electrical signal are mapped with respect to magnetic fields associated with the magnetic particles.

In one further specific embodiment, the chemical or biological agents are scanned by a vector magnetometer mounted on a proximal probe tip and a fringe field is generated at an edge of a ferromagnetic film in response to a vector component of a particle's magnetic field acting on the ferromagnetic film where the edge of the ferromagnetic film is located adjacent to a second voltage axis such that the fringe field is perpendicular to the current axis. A second electrical signal is generated along the second voltage axis in response to the fringe field acting on the electrical current in the second section of the conducting substrate. The second electrical signal is recorded and values of the second electrical signal, along with the values of the first electrical signal, are mapped with respect to magnetic fields associated with the magnetic particles.

In accordance with yet another aspect of the present invention, a cell array is provided which includes integrated Hall effect devices for measuring the vector components of an external magnetic field of an object. The cell array includes a plurality of rows comprising a plurality of integrated Hall effect devices. Each Hall effect device is electrically connected to each other along a current axis. Each of the plurality of integrated Hall effect devices includes a conductor substrate having a top surface with a first section and second section, which are capable of carrying an electrical current. The first section is positioned in close proximity to the second section such that a first electrical signal can be generated in response to one of the vector components of the external magnetic field acting perpendicularly on the electrical current in the conducting substrate. A ferromagnetic film is provided having at least two configurable magnetization orientation states and is positioned disposed over a portion of the second section such that a fringe magnetic field can be generated from an edge of the ferromagnetic film by vector components of the external magnetic field acting on the magnetic film wherein a second electrical current can be generated in response to the fringe magnetic field acting on an electrical current in the conductor substrate.

The present invention offers numerous advantages over prior devices. For example, sensors based on Hall devices according to the present invention offer numerous advantages and are superior in many ways to MR sensors known in the art. The present sensors have linear response over a large field range, and they can be fabricated on a small size scale with highly reproducible characteristics.

In addition, the present invention provides for a superior magnetometer that is sensitive to single components of field. In addition, a vector magnetometer, in accordance with the present invention, can be adapted to sense a magnetic field and, using knowledge and properties of the vector components, can also be used to detect and identify an object that is the source of field. Further, the present vector magnetometer may also be used to analyze the position and motion of such an object.

A further advantage of the present invention is that the present device is readily integrated and can be manufactured and packaged using inexpensive techniques. It is therefore inexpensive, and is much less expensive than scalar magnetometers such as flux gates and SQUIDs.

Further features and advantages of the present invention will be set forth in, or apparent from, the detailed description of preferred embodiments thereof which follows.

BRIEF DESCRIPTION OF THE DRAWING

The invention will now be described in detail with respect to preferred embodiments with reference to the accompanying drawings, wherein.

DETAILED DESCRIPTION OF THE INVENTION

Figure 2A:
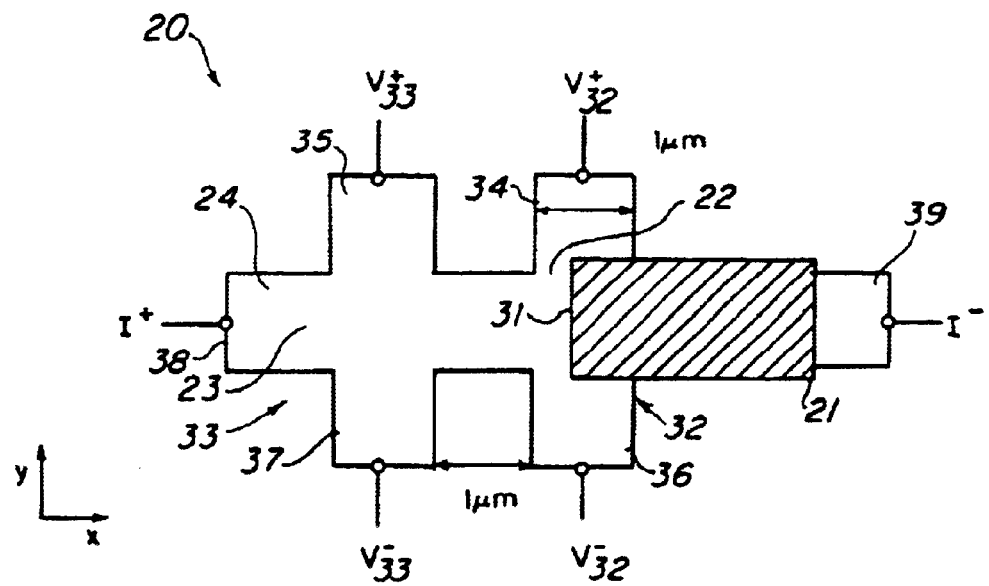
FIG. 2(a) is a plan view of a hybrid Hall device in accordance with the present invention and FIG. 2(b) is a cross sectional view of the hybrid Hall device of FIG. 2(a)
Figure 2B:
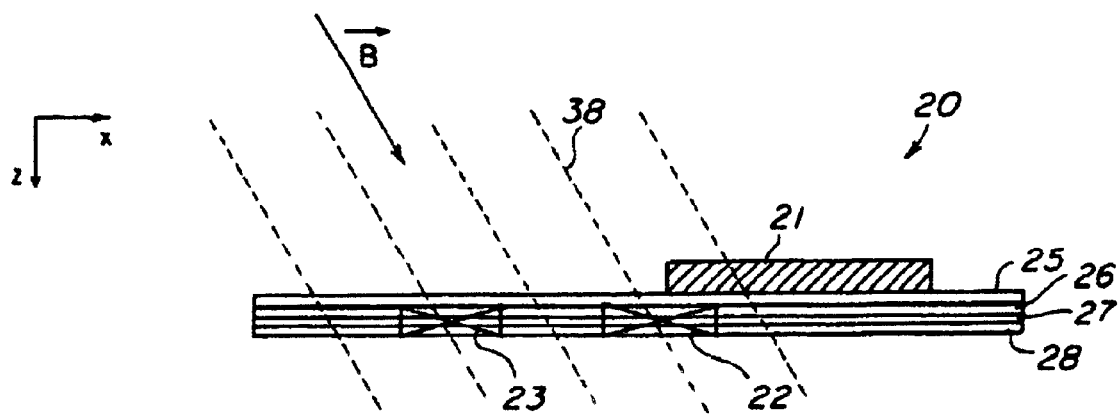

The basic device structure for a modified hybrid Hall device 20 that measures two vector field components is depicted in FIGS. 2(a) and 2(b). A standard Hall plate 24 is fabricated using conventional techniques known in the art to form two Hall crosses 22, 23, which are adapted to function as two Hall sensors generally denoted as 32, 33. The Hall crosses 22, 23, each have a first arm 34, 35 and a second arm 36, 37, respectively.

Figure 1A:
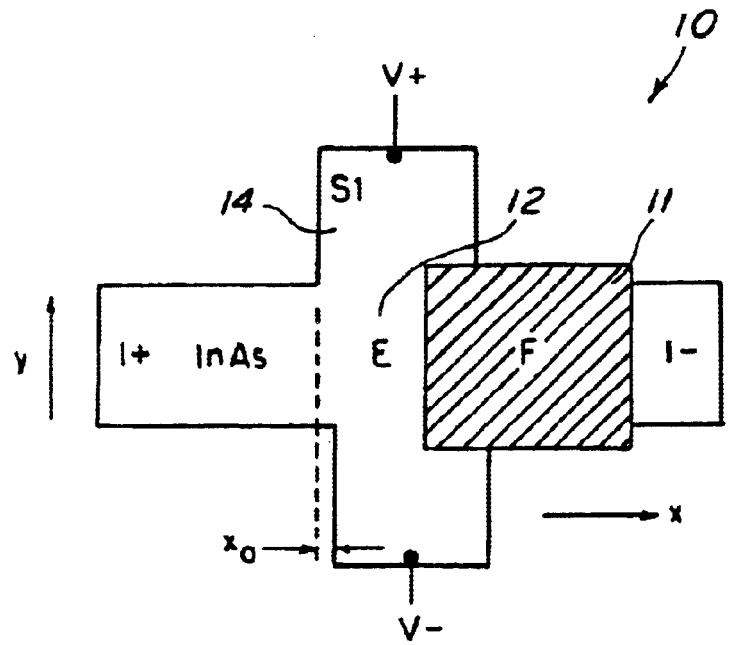
FIG. 1(a), which was described above, is a plan view of a prior art hybrid Hall effect device and FIG. 1(b), which was also described above, is a cross sectional view of the hybrid Hall device of FIG. 1(a)
Figure 1B:
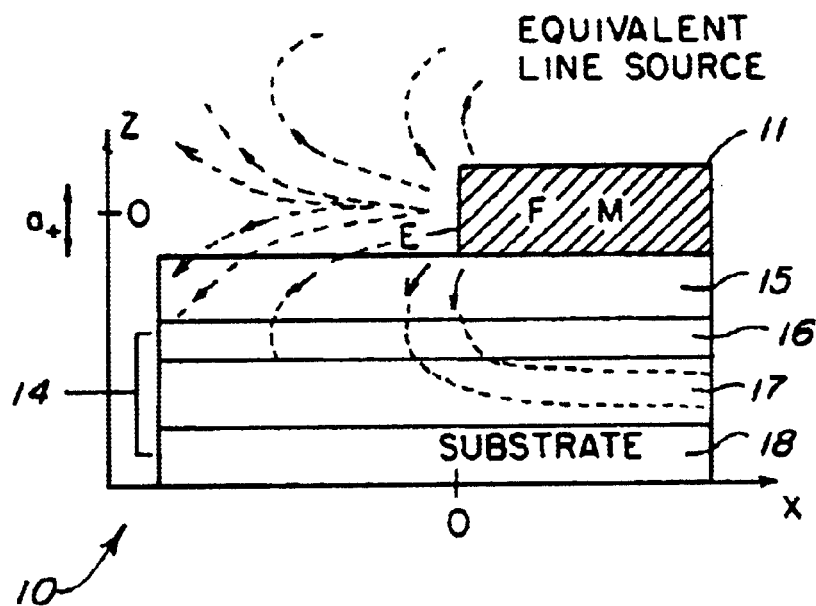

The Hall cross 22 is located in close proximity to Hall cross 23 and is formed in a manner consistent with that in the prior art Hall sensor 10 of FIG. 1. A thin, microstructured ferromagnetic film 21 is fabricated over the Hall cross 22 and positioned such that edge 31 of the ferromagnetic film 21 is over the central region of the Hall cross 22 and a fringe magnetic field emanates or projects from the edge 31 of the ferromagnetic film 21. The ferromagnetic film 21 is electrically isolated from the surface of Hall plate 24 by a thin insulating layer 25, which has a magnetization anisotropy in the plane of film 21, and acts as a source of magnetic field.

For the purposes of this invention, "proximity" is defined relative to the spatial scale of the homogeneity of the vector magnetic field to be measured. Each of the sections of the vector magnetometer should be fabricated in proximity with each other, where the proximal spacing d varies according to the application. For remote sensing of fields that have small variation on a length scale of meters, spacing d can be 10 mm or larger. In practice, procedures of integrated fabrication will likely dictate a spacing no larger than 10 mm. An example of this kind is the remote sensing of a magnetic field associated with a large vehicle, such as an armored tank. At distances of the order of a kilometer, the magnetic field from the tank will have a small variation on the length scale on the order of 1 meter. On the other hand, magnetic fields associated with small magnetic particles may vary on a length scale of tens of nm. In this case, spacing d may be the smallest feature size available with the fabrication process. Indeed, it may be preferred to fabricate the device with sections adjacent to each other, wherein the spacing is zero.

In one exemplary form, a semi-insulating buffer layer 27 is formed over substrate 28 (See FIG. 2(b). The buffer layer 27 is composed of 200 nm $Al_{0.6}Ga_{0.4}Sb/3$ μm AlSb. An InAs layer 26 is grown on the buffer layer 27 by molecular beam epitaxy (MBE) to form a high mobility heterostructure.

The InAs layer 26 consists of: 3 nm $InAs/25$ nm $Al_{0.6}Ga_{0.4}Sb$ and a 15 nm InAs layer which is doped by an arsenic soak in the middle of the 25 nm $Al_{0.6}Ga_{0.4}Sb$ barrier to form a conductive substrate. The Hall crosses 22, 23 are fabricated on a micron or submicron scale by conventional photolithography or electron beam lithography and standard mesa etch techniques known in the art.

In a typical mode of operation, a bias current, $I^+$, is applied to a first bias arm 38 and a second bias arm 39 and is removed at ground (denoted by $I^-$), flowing along $\hat{x}$. A Hall voltage V is measured in each sensor as $V_{H,33}=V_{33,+}-V_{33,-}$ and $V_{H,32}=V_{32,+}-V_{32,-}$. In the cross-sectional view of FIG. 2(b), a homogeneous external field $\overline{B}$ (depicted with dotted field lines 38) is to be measured. Hall sensor 33 measures the $\hat{z}$ field component, and Hall sensor 32 measures the convolution of the $\hat{x}$ and $\hat{z}$ field components. The $\hat{x}$ component is derived by subtracting the voltage $V_{H,33}$ from $V_{H,32}$, with the resulting voltage directly proportional to $B_x$.

Figure 2C:
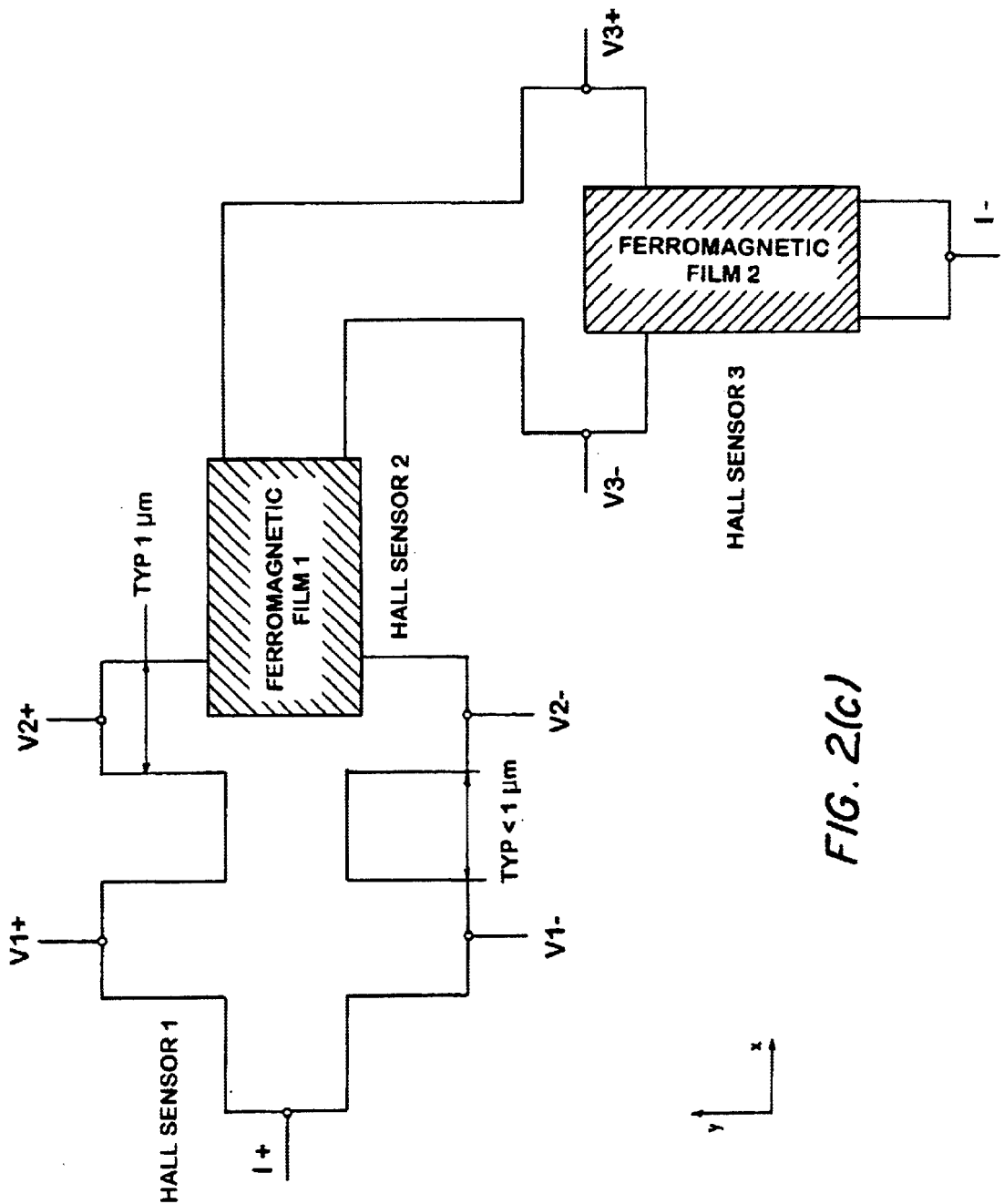
FIG. 2(c) is a plan view of a hybrid Hall device including three Hall crosses in accordance with the present invention.

One of ordinary skill in the art will readily appreciate that it is straightforward to add a third device as a third Hall sensor as shown in FIG. 2(c) with a bias current arm oriented along $\hat{y}$ and a ferromagnetic element that spans the current bias arm. The standard Hall plate 24 is fabricated to form three Hall crosses 23, 22 and 46 that are adapted to function as a first Hall sensor 33, a second Hall sensor 32, and a third Hall sensor 51. A second ferromagnetic film 48 is fabricated over the Hall cross 46 and is positioned such that edge 47 of the ferromagnetic film 48 is over the central region of the Hall cross 46. The ferromagnetic film 48 can be isolated from the surface of the Hall plate 24 by a thin insulating layer or film as previously described. The Hall cross 46 has a first arm 50 and a second arm 49 defining a third voltage axis. Hall cross 46 has a third bias arm 52 and a fourth bias arm 53 defining a second bias current axis oriented along $\hat{y}$. The second bias current axis is connected electrically in series with the first bias current axis so that current I⁺ applied to arm 38 flows down the first bias axis, along $\hat{x}$, and proceeds down the second axis, along $\hat{y}$, to ground I⁻ at arm 52. The second bias current, applied to bias arms 52 and 53, respectively, produce a voltage $V_{51}$ measured in Hall sensor 53 as $V_{H,51}=V_{51,+}-V_{51,-}$ across the third voltage axis 40 and 50. Such a third Hall sensor would measure the convolution of the $\hat{y}$ and $\hat{z}$ field components, and the $\hat{y}$ component can be readily derived by subtracting the $\hat{z}$ component measured by Hall sensor 33.

For simplicity of discussion and clarity of the drawings, the following discussion is limited to a two-component device. However, one skilled in the art will be able to apply the principles provided herein to that of a three-component device.

A vector magnetometer incorporating sensor 20 can be fabricated on a small size scale for applications where spatial resolution is important. Each Hall sensor 32, 33 can be lithographically formed with a feature size of 1 $\mu$m being readily attained and a minimum feature size $f$ of 0.1 $\mu$m being possible. Similarly, the two Hall sensors 32, 33 can be placed in close proximity, typically separated by $f$.

Figure 3:
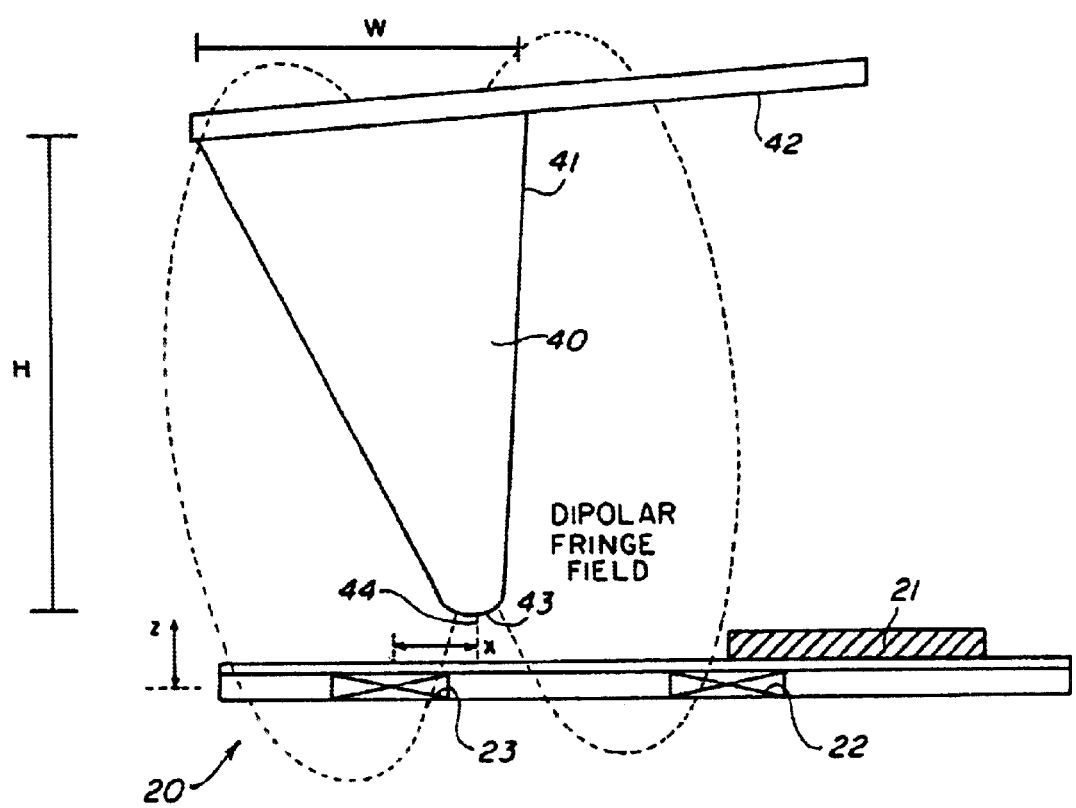
FIG. 3 is a cross sectional view of a magnetic force microscope (MFM) tip and the hybrid Hall device of FIG. 2(b)

Sensor 20 can be employed for use in numerous applications including the following, non-limiting example depicted in FIG. 3. In this example, sensor 20 is employed in an application for which spatial resolution is important in the calibration of a magnetic force microscope (MFM) tip 40. The tip 40 has a height H and base 41 with a width W of about 10 $\mu$m. The base 41 attached to a scanning cantilever 42. The radius of curvature of the end 43 of the tip 40 is typically about 50 nm. Tip 43 is coated with a ferromagnetic thin film of about 10 nm thick. Dipolar magnetic fields, with steep field gradients, emanate from the end 43.

During MFM operation, the tip 40 is scanned across a surface of sensor 20 at a variable height $z_0$ on the order of 0 to 100 nm. Magnetic tip 40 may have a unique domain structure and field pattern whereby the sensor 20 can be advantageously used to calibrate magnetic tip 40 by measuring a profile of the dipolar magnetic field from the tip 40.

The magnetic field profile is readily achieved by scanning the tip 40 across a Hall vector magnetometer incorporating sensor 20, at a variety of scan heights, $z_0$, on the order of about 0 to 2000 nm. Although an adequate profile can be achieved by scanning MFM tip 40 across the simple hybrid Hall device such as sensor 33 of FIG. 2, a superior magnetic profile is achievable by scanning across a Hall vector magnetometer which also employs both a conventional Hall sensor, i.e. Hall sensor 33, in conjunction with a hybrid Hall sensor, i.e. Hall sensor 32. In the former case, a novel method is provided for by using the prior Hall device 10 to map the spatial magnitude of magnetic fields by scanning a magnetic source, and calibrating MFM tips by using such a procedure.

Data to calibrate the MFM tip 40 is acquired by scanning the tip 40 across Hall sensor 32 while recording an AFM image in order to locate the center of the Hall cross 22. The Hall sensor 32 is then biased with an AC current of 10 $\mu$A at 10 KHz, and the Hall voltage $V_H$ was recorded as the tip 40 is raised and lowered through different heights $z_0$ as shown in FIG. 3. A detailed discussion of these experiments is presented as the following non-limiting experiments.

MFM Calibration Experiments

The photolithographically defined Hall sensor 32 was scanned in a Tapping Mode using a high moment MFM tip (HM-MESP from Digital Instruments, hereinafter "DI"). This tip has a nominal moment of $3\times10^{-13}$ emu and the nominal radius of curvature at the end of the tip is 50 nm, as provided by DI. The Hall sensor 32 was driven by a 10 KHz, 5 V p-p signal from a lockin amplifier in series with a 0.51 M$\Omega$ resistor to ensure a constant current source of about 10 $\mu$A. The Hall voltage $V_H$ was then detected with a full scale sensitivity of 100 $\mu$V and the $\pm$10 V signal monitor output of the lockin amplifier was applied to the auxD channel of a DI Signal Access Module and recorded as channel 2 deflection voltage. This means that the input voltage range was preserved when recorded by AFM software, e.g. 1 V input, was 1 V recorded.

Figure 4A:
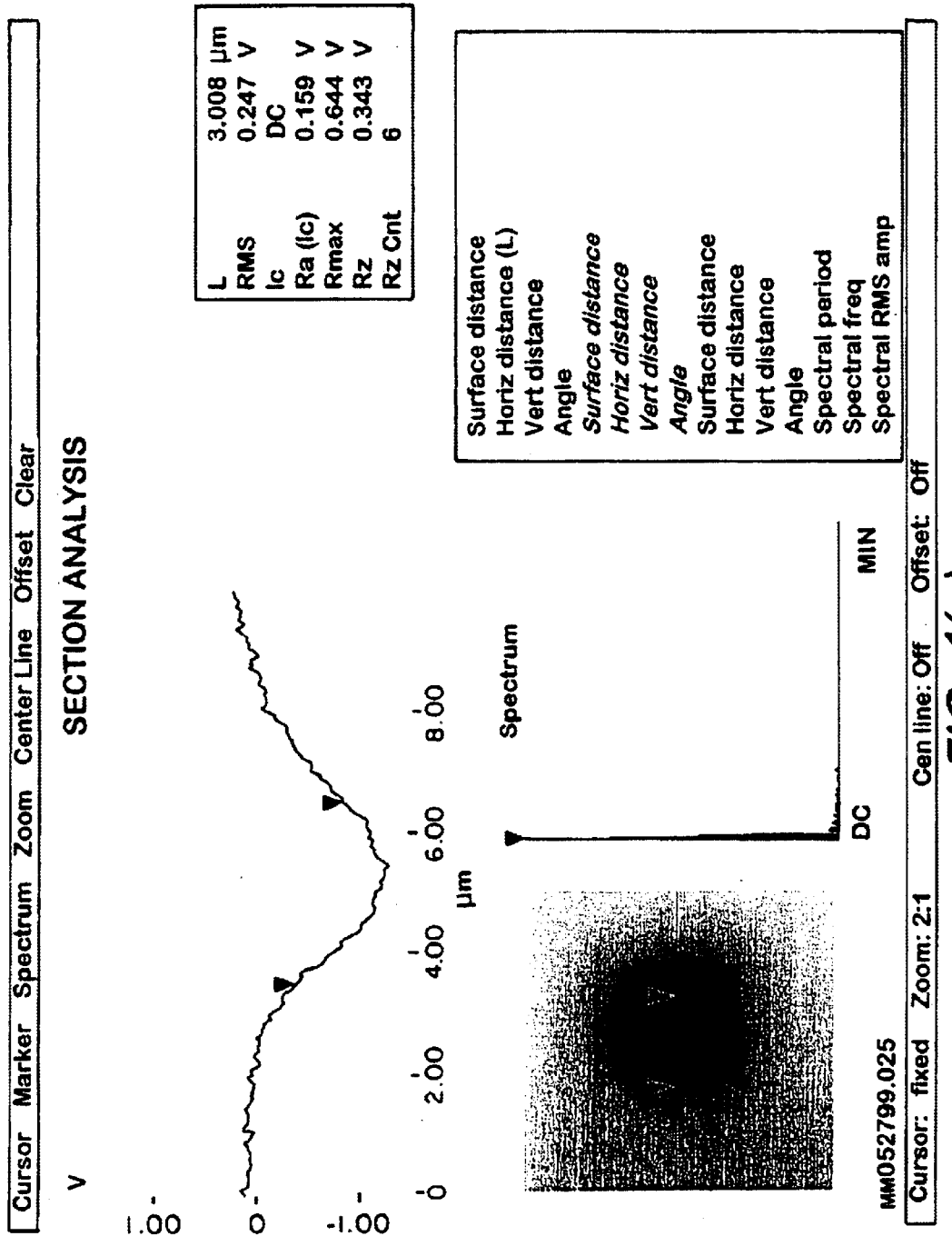
FIG. 4(a) depicts a sample trace using the hybrid Hall device and MFM tip configuration of FIG. 3.
Figure 4B:
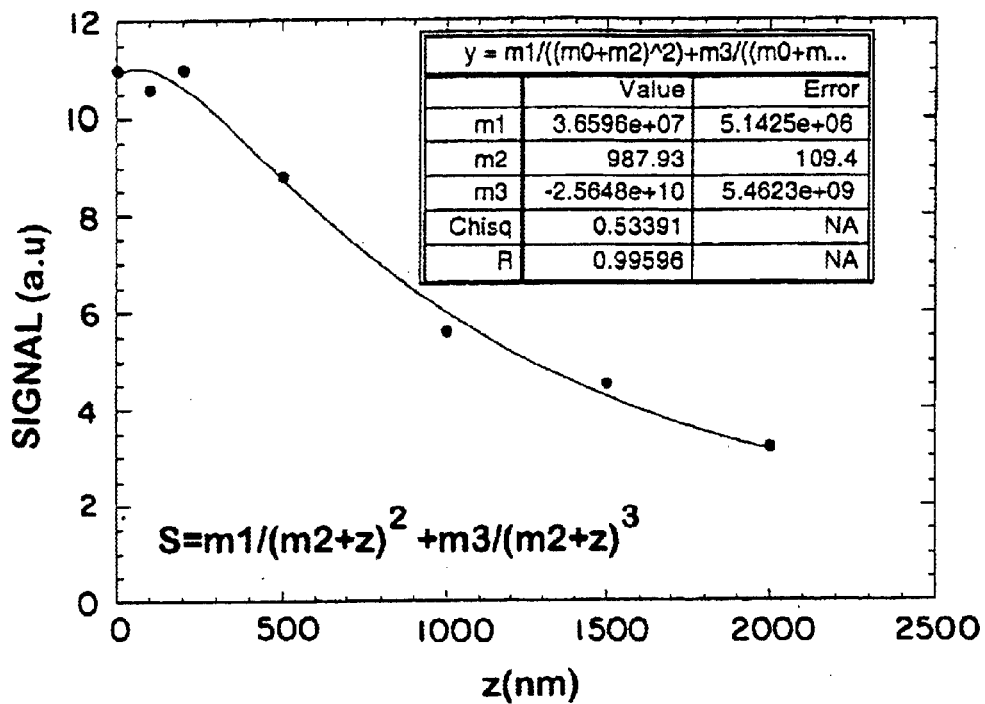
FIG. 4(b) is a plot of the peak Hall voltage as a function of lift height and fitting to a monopole and dipole term for the configuration of FIG. 3.

A series of measurements was then made by scanning a line through the center of the Hall cross 22 for varying lift heights (0 nm to 2000 nm) and the corresponding Hall voltages recorded. FIG. 4(a) shows a sample trace for $z_0$=zero. The peak Hall voltage was then plotted as a function of $z_0$ and fitted to a monopole and dipole term, as shown in FIG. 4(b).

The results can be modeled in the following way. The Hall cross 22 is coated with a 27 nm thick insulating layer of $SiO_2$. If one assumes that the tip can be represented by a magnetic sphere 50 nm in radius, then the z-component of the magnetic field at the Hall cross with the tip in contact with the $SiO_2$ layer will be about 1300 Oe. This is simply calculated from the dipole field which has the form $$H_z = \frac{2m}{z^3},$$

where z is the sum of the $SiO_2$ layer thickness, the tip radius and the tip-sample separation distance (i.e. the distance between the center of the dipole and the Hall cross). The magnetic dipole moment is taken from the vendor (Digital Instruments) to be about $3\times10^{-13}$ emu. For a spherical tip in contact with the sample, the lateral dependence of the field is given by $$H_z(x) = \frac{m(2z^2 - x^2)}{(x^2 + z^2)^{5/2}}.$$

Figure 4C:
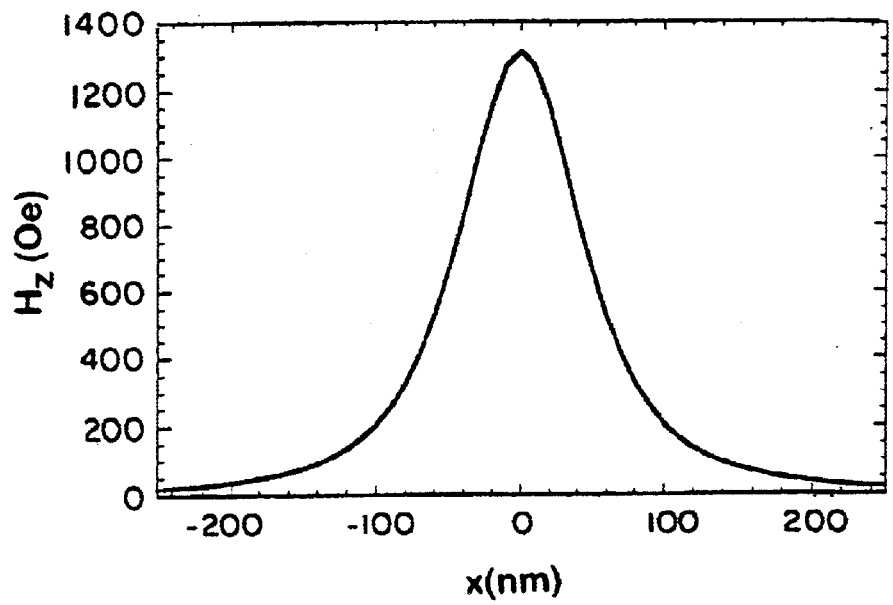
FIG. 4(c) is a plot of the field profile for the MFM tip of FIG. 3.

This field profile is shown in FIG. 4(c). The profile is sharply peaked with a FWHM of about 100 nm. If this field profile is centered on the Hall cross 22 and integrated over the expected 5 µm extent of the cross sensing area, the average value of the magnetic field becomes about 20 Oe. The sensitivity of the Hall cross 22 was measured using a uniform, externally applied field to be $3.5 \times 10^{-7}$ V/Oe. For zero lift height, the expected signal for the peak field of 1300 Oe should be about 450 µV. However, using the average value of field, the expected signal would be about 7 µV. The actual value is about 11 µV, which is in very good agreement especially since the true sensing area is unknown and the tip is not a pure dipole and the value of the dipole moment is only approximately known. It should be noted that uncertainties in this model become relatively smaller as the dimensions of the Hall cross shrink, and highly accurate measurements are expected for sub-micron Hall crosses.

In a conceptually similar operational mode, a vector magnetometer, incorporating sensor 20, can be fabricated on a chip and attached to a scanning apparatus. The sensor 20 can then be adapted to be scanned across samples of interest. While a simple scalar scanning Hall magnetometer is sensitive to the scalar value of the magnetic field component perpendicular to the device plane, the present vector magnetometer is sensitive to two or three field components and therefore sensor 20 provides enhanced, i.e. greater, sensitivity. Moreover, sensor 20 affords greater utility because the detection of vector magnetic fields enables more reliable identification of the field source.

An additional specific application of a scanning vector magnetometer, incorporating the present hybrid Hall sensor, is for the identification of chemical or biological agents that have been tagged with microscopic magnetic particles. The identification proceeds by, first, partially coating a sample molecule or system of molecules, such as a biological organism or agent, with magnetic particles having a diameter $d_p$, where $0.5 \, \mu m < d_p < 5 \, \mu m$. The magnetic particles stick to the molecule at particular sites. Subsequently, the sample is scanned and identified via a unique detection pattern corresponding to the sample.

Figure 5:
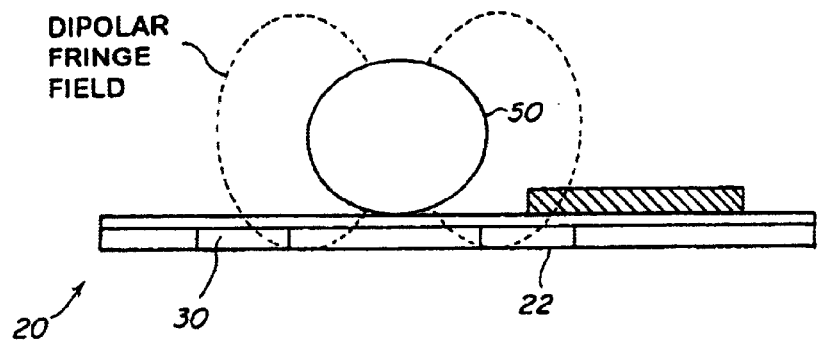
FIG. 5 is a cross sectional view of the hybrid Hall device of FIG. 2 adapted to measure the magnetic field associated with a chemical or molecular molecule in accordance with the present invention.

The magnetic particles may have an intrinsic magnetic moment and generate magnetic fringe fields in a zero applied field, or they may develop an appropriate moment in the presence of a small-applied field. A scanning vector magnetometer-incorporating sensor 20 can detect magnetic particle 50 as shown in FIG. 5. As will now be readily apparent to one skilled in the art, the use of the sensor 20 provides detection of two or more components of the field the detection process, which is more sensitive and reliable than is possible by simple scalar magnetometers. By scanning across a grid that includes a sample such as the magnetic particle 50, a vector magnetometer-incorporating sensor 20 can plot a map of the locally strong magnetic fields associated with the particles, and with such a map the sample molecule can be identified.

In the above example, sensor devices fabricated with small dimensions are required for the spatial resolution necessary to detect fringe magnetic fields from microscopic sources. There are many applications, however, where spatial resolution is not important. In these cases, device dimensions may be of the order of 1 to 10 µm.

One skilled in the art will appreciate that the field sensitivity of a Hall sensor is a function of the intrinsic sensitivity of the device and the sensing circuit. The intrinsic sensitivity is proportional to the Hall coefficient $R_H$, and is usually given in units of Ω/Tesla. For example, prototypes of sensor 20 have shown an intrinsic sensitivity of 350 Ω/Tesla for both $B_z$ and $B_x$ measurements, and higher sensitivities are feasible.

Sensor 20 may also be employed for DC measurements of steady state fields as part of a circuit, for example, using a simple sense circuit having a 0.1 mA DC current source, a digital voltmeter, and a resulting sensitivity of about 5 mΩ. The corresponding field sensitivity, for static or slowly varying fields, is on the order of 0.1 Oe. A simple linear feedback circuit can be integrated with a Hall sensor 20 and packaged inexpensively by using the method provided in Horowitz and Hill, *The Art of Electronics* (1989). The resulting sensitivity of $1 \times 10^{-4}$ Ω corresponds to an absolute field sensitivity of order $10^{-3}$ Oe.

In some applications of magnetometry, the absolute value of magnetic field is needed. Since conventional Hall sensors tend to suffer from a small but random output offset, a variety of techniques previously have been used to compensate for this offset. In applications requiring an absolute value of magnetic field, magnetometry is used to sense the field associated with an object. However, using the present Hall sensor such as sensor 20, the baseline value of field, or any offset inherent in the device, is not important because the sense circuit can be built to detect a change in output value that is to be associated with the presence of the field from the object to be detected. Equivalently stated, any initial offset can be subtracted.

There are numerous examples of applications where spatial resolution is not required, such as remote sensing. Objects of interest, such as vehicles, tanks, or submarines, have sufficient iron content that they have a small magnetic moment. The moment generates stray fields, which can be detected at distances of the order of 100 to 1000 meters.

A vector magnetometer incorporating sensor 20 offers enhanced sensitivity and further offers the ability to first detect a small field, but also to identify the object that is the source of the field by comparing details of the measured vector field with simple models that can be stored in memory. Because the present vector magnetometer can be packaged as an inexpensive system with no maintenance and low power requirements, it can be deployed in remote applications.

The foregoing discussion has described the application of a pair or a trio of Hall devices for the measurement of two or three vector components of magnetic field. In addition, the present hybrid device can be employed as hybrid Hall device field sensing cells using the techniques of forming two-dimensional arrays of Hall cells using the array method disclosed in U.S. Pat. No. 5,652,445. By considering each pair (FIG. 6(*a*)) or trio (FIG. 6(*b*)) of devices as a single vector magnetometer cell, one can employ these array techniques to address novel applications of vector magnetometry. In particular, these novel applications require high spatial resolution of magnetic fields. Rather than scanning a vector magnetometer across a field that includes an object of interest, an integrated array of devices fills the field, an object is introduced onto the array, and the output values of the cells are read out in rapid succession.

Figure 6A:
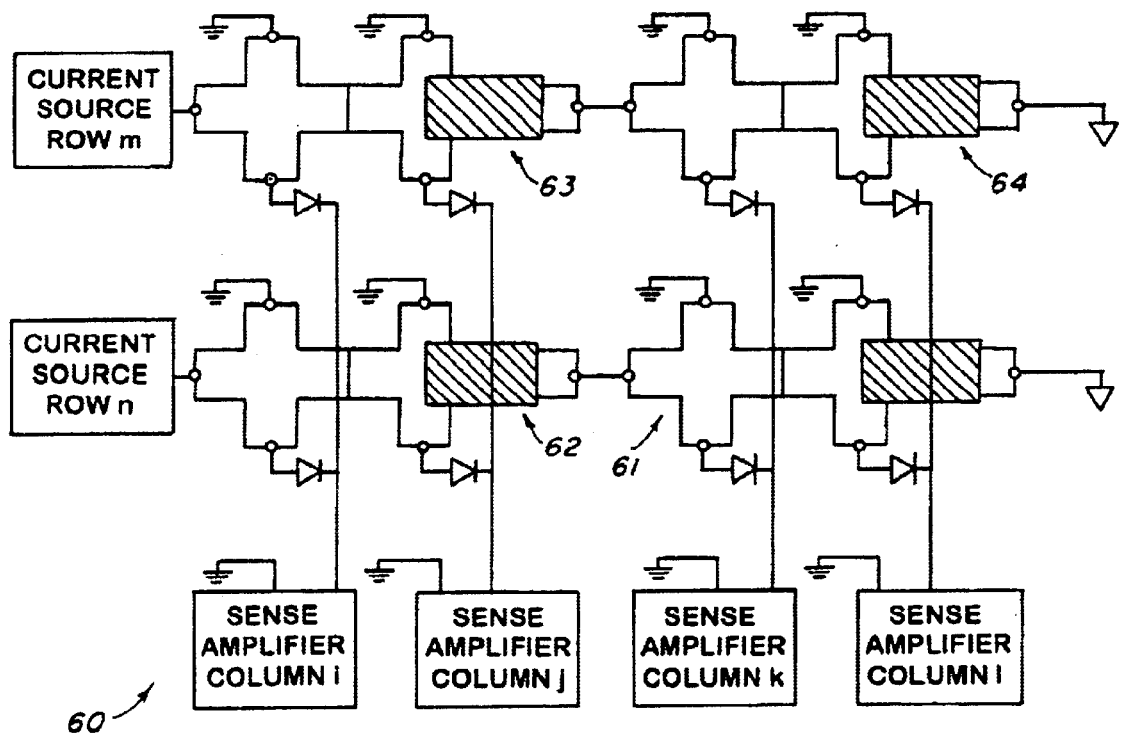
FIG. 6(a) is a plan view of an array of hybrid Hall devices in accordance with the present invention.

An example of such an array is array 60, depicted schematically in FIG. 6(*a*), for the simple case of two columns and two rows (although any desired number of rows and columns can be used) of 2-component vector magnetometer cells, 61, 62, 63, and 64. Each vector magnetometer cell 61, 62, 63, 64 is formed from an individual sensor 20 (FIG. 2(*a*)) and is fabricated with a small asymmetry as disclosed in "Hybrid Hall Effect Device," by Mark Johnson et al., so that the voltage output is always positive. FIG. 6(*b*) depicts schematically an array 69 of two columns and two rows of 3-component vector magnetometer cells 65, 66, 67, and 68.

To read the output voltage of any component of a device employing array 60, a small bias current or voltage is applied to row m and a voltage is recorded at the sense amplifier for column i. If there is sufficiently high impedance between voltage ground and current ground, the bias current will flow down the row. Thus, a simple diode, such as a Schottky diode, can be used for isolating each device from the sense amplifier line that is common to the column.

While array 60 represents a particularly simple means for cell isolation, it will be clear to those skilled in the art that a variety of devices could be used to achieve this function. One typical example would be a field effect transistor (FET). With appropriate isolation, the sense voltage from the device (i, m) is transmitted to the sense amplifier and is not diminished by dissipation through the cell (i, n).

The vector magnetometer array 60 has a spatial resolution, which is a convolution of the device dimension and the pitch between cells. In practice, this can be the order of a few microns, and can be made as small as the order of 0.1 micron. The array 60 can be adapted for sensing magnetic fields that are spatially varying on this scale.

An example of one application, which employs the array 60, is the detection of microscopic magnetic particles used to tag chemical or biological agents, as described above. Each Hall device, i.e. cells 61–64, in the array 60 may have a unique offset value, so the initial value of the array 60 is first measured and stored in memory. Next, a target molecule or system of molecules, such as a biological agent or organism is tagged with biofunctionalized microscopic magnetic particles and is placed on the array 60. The target may be fixed to the surface of array 60 by selective chemical bonding to biochemical agents that have functionalized the surface of the array. The local magnetic fields associated with individual particles cause a voltage response in different cells in the array 60. The value of the array is then measured, and the subsequent data processing is simple. The initial value of the array 60 is subtracted, values of the $B_z$ sensor are subtracted from those of the $B_x$ sensor for each cell, and the remaining array of values is a map of the z and x components of field associated with magnetic particles. From the map, the location of particles can be identified and the molecule or system of molecules can be identified.

Figure 7A:
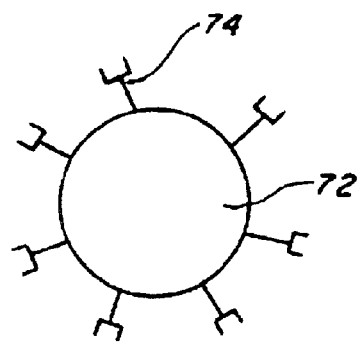
FIGS. 7(a) through 7(e) are schematic views of a hybrid Hall device in the various stages of a first type of sandwich assay in accordance with the present invention.
Figure 7B:
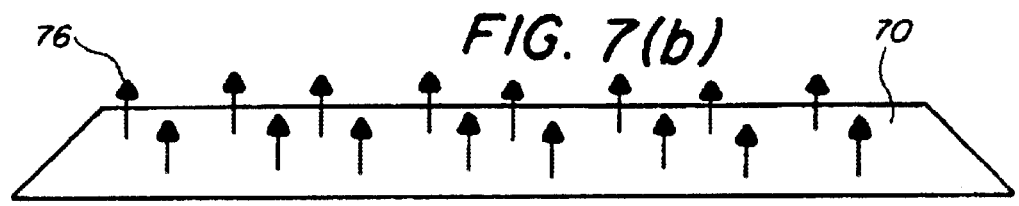
Figure 7C:
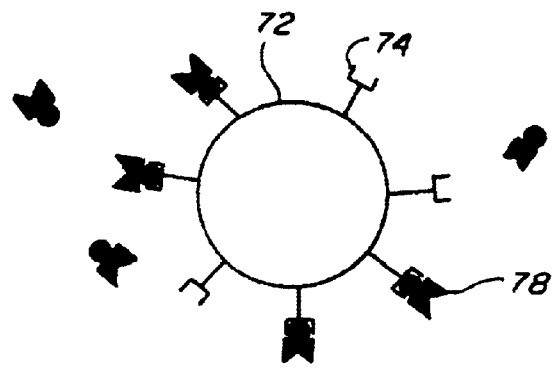
Figure 7D:
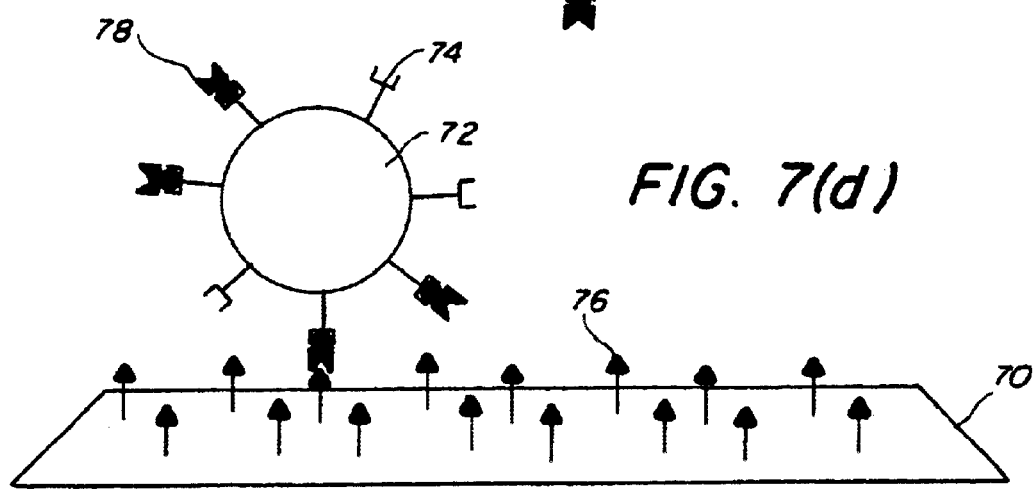
Figure 7E:
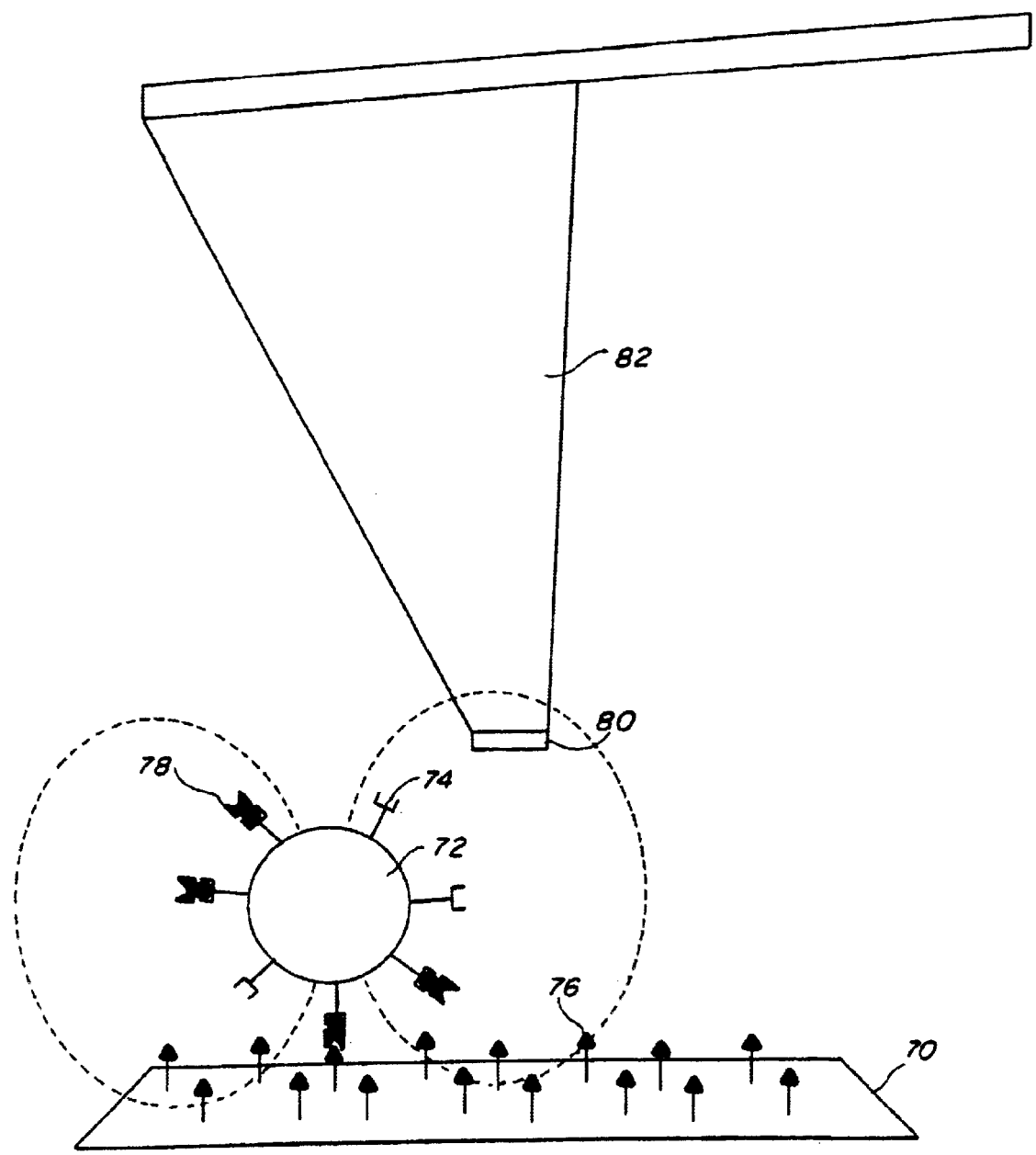

FIGS. 7(a)–(e), 8(a)–(e) and 9(a)–(e) depict three ways of doing a sandwich assay. In FIG. 7(a), a magnetic particle 72 is functionalized with a first agent 74 (e.g. an enzyme, antigen or segment of DNA). In FIG. 7(b), a flat, level surface 70 is functionalized with a second agent 76. In FIG. 7(c), the functionalized magnetic particles are admitted to the solution that contains the sample. If the target species 78 (biological or chemical) is present in the sample then it will bind to the first functionalizing agent 74 that is on the surface of the particle 72. This process is called tagging. One can state that one or more of the target species 78 is tagged with the magnetic particle 72, or equivalently that the magnetic particle 72 is tagged with the target 78. In FIG. 7(d), the sample solution is admitted to the flat surface 70. Target species 78 bind to the second functionalizing agent 76 on the flat surface 70, thereby binding the magnetic particle 72 in close proximity to the flat surface 70. This step is often followed by a rinse, such that magnetic particles 72 which are not bound to target species 78 will be removed from the surface. In FIG. 7(e), a Hall detector 80 (which may have 1, 2 or 3 sections) is fixed to a proximal probe tip 82, and the tip assembly is scanned over the flat surface 70. The magnetic particle 72 is identified by detecting (and/or measuring) the fringe magnetic field from the magnetic particle 72, and the presence of the target species 78 is thereby inferred. The number of targets 78 can be calculated from the number of magnetic particles 72 detected in a mapping of the surface 70. This assay technique may be called "tagged particle" because the target species 78 binds to the magnetic particles 72 before binding to the surface 70.

Figure 8A:
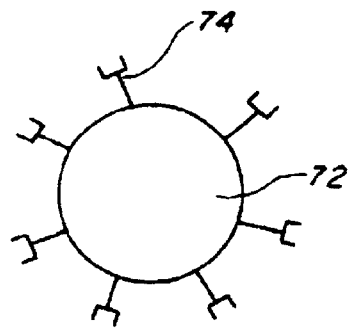
FIGS. 8(a) through 8(e) are schematic views of a hybrid Hall device in the various stages of a second type of sandwich assay in accordance with the present invention.
Figure 8B:
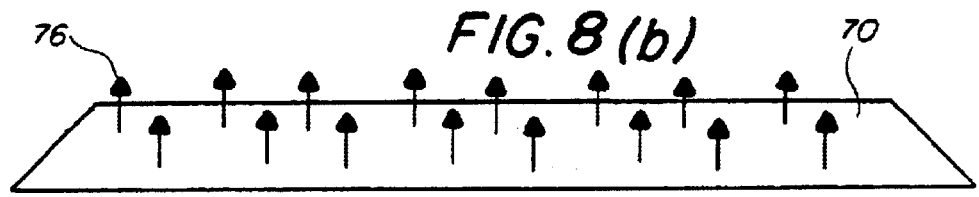
Figure 8C:
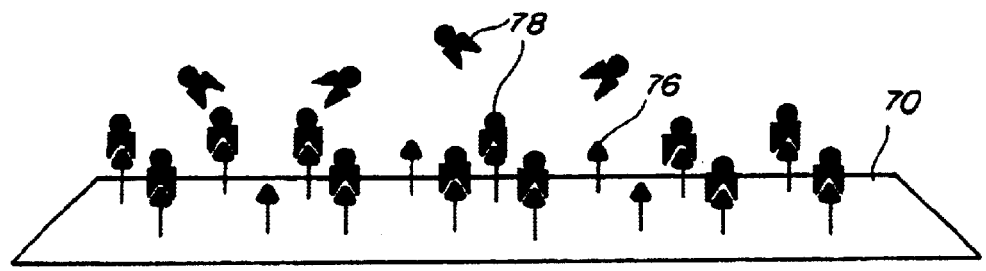
Figure 8D:
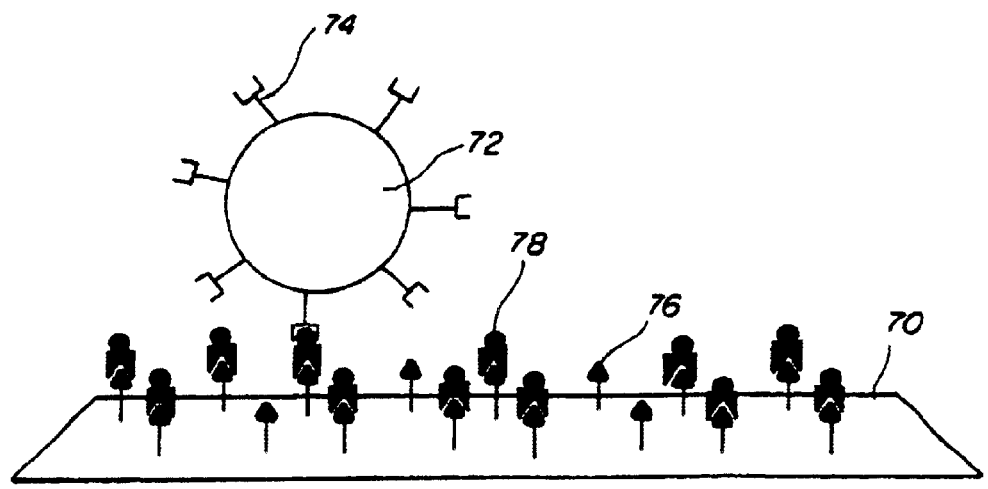
Figure 8E:
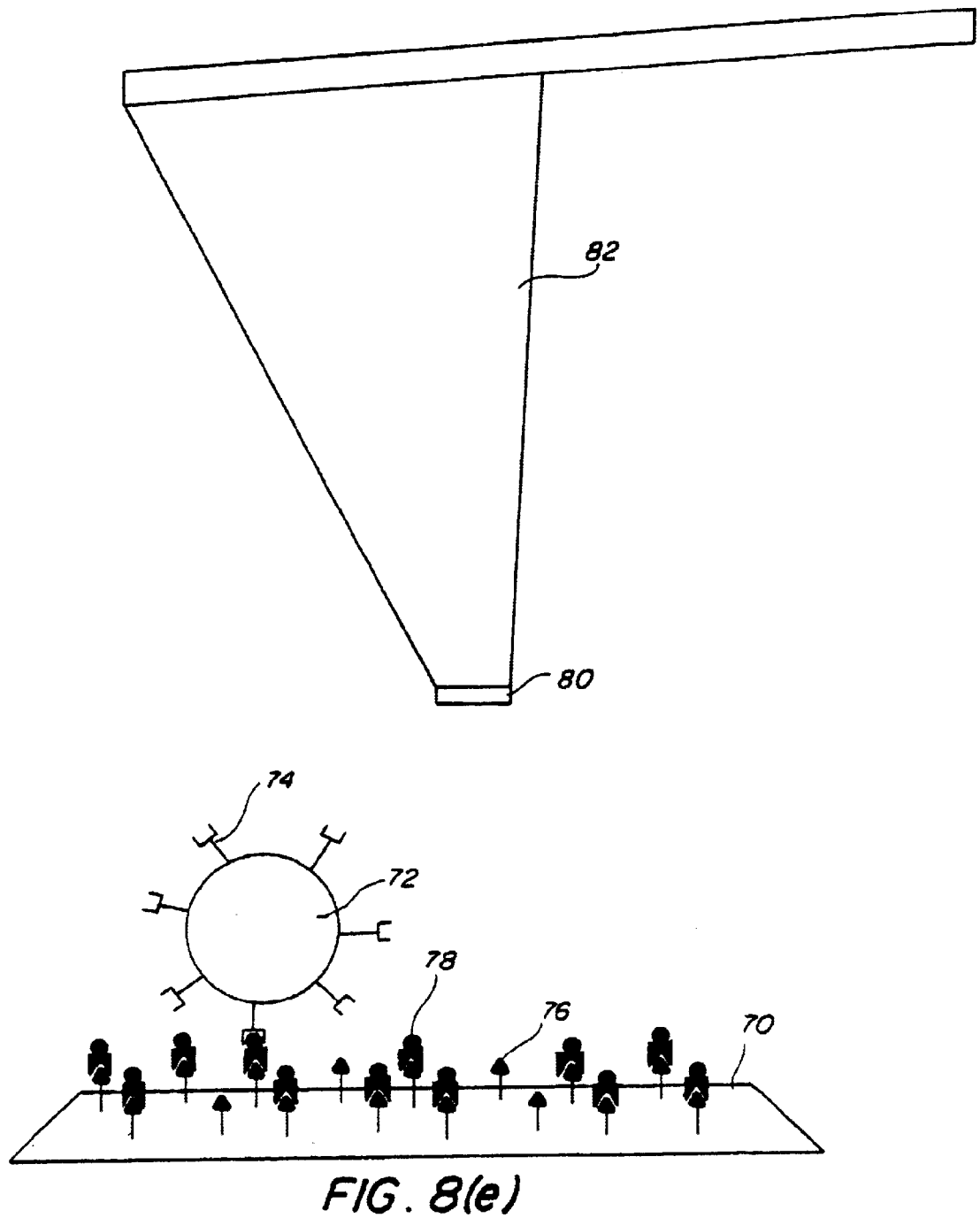

FIGS. 8(a)–(e) represent a variation of the process depicted with FIGS. 7(a)–(e). As before, the magnetic particle 72 is functionalized with a first agent 74, and the surface is functionalized with a second agent 76. Here, the sample solution containing the target species 78 is applied to the flat surface 70 [as shown in FIG. 8(c)], and target species 78 will bind to the functionalizing agent 76. This step is often followed by a rinse. Now the separate solution with the functionalized magnetic particles 72 is applied to the flat surface 70 [as shown in FIG. 8(d)]. If target species 78 have bonded to the surface 70, the magnetic particle 72 will bind to the target species 78. This step is often followed by a rinse to remove unbound magnetic particles 78. FIG. 8(e) depicts the same scanning procedure discussed in FIG. 7(e), and the presence of the target species 78 is again inferred from the detection of magnetic particles 72. This assay technique may be called "tagged surface" because the target species 78 binds to surface 70 before binding to the magnetic particles 72. The methods shown in FIGS. 7(a)–(e) and 8(a)–(e) can both be used, but the former is probably more popular. In the methods of FIGS. 7(a)–(e) and 8(a)–(e), a single sensor 80 (with 1, 2 or 3 sections) is used to make multiple readings, each reading producing 1, 2 or 3 electrical signals in proportion to the local magnetic field when a sensor 80 with only one section is used. A simple scalar mapping of the field is possible. Better mapping becomes available with the addition of the second and/or third section to sensor 80.

Figure 9:
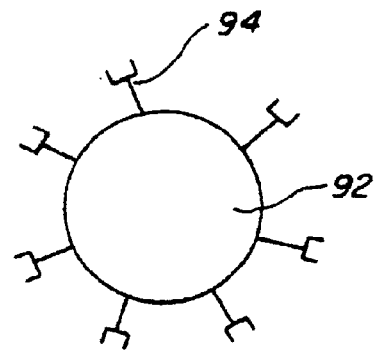
FIGS. 9(a) through 9(e) are schematic views of a hybrid Hall device in the various stages of a third type of sandwich assay in accordance with the present invention.
Figure 9:
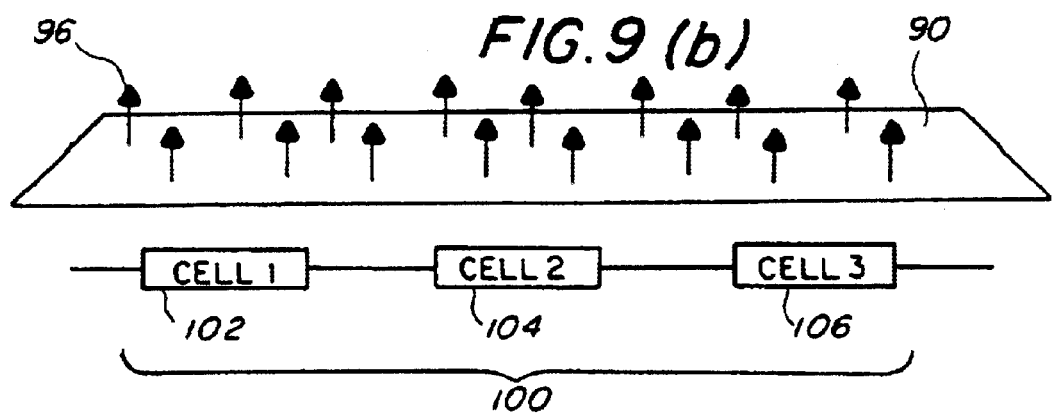
Figure 9:
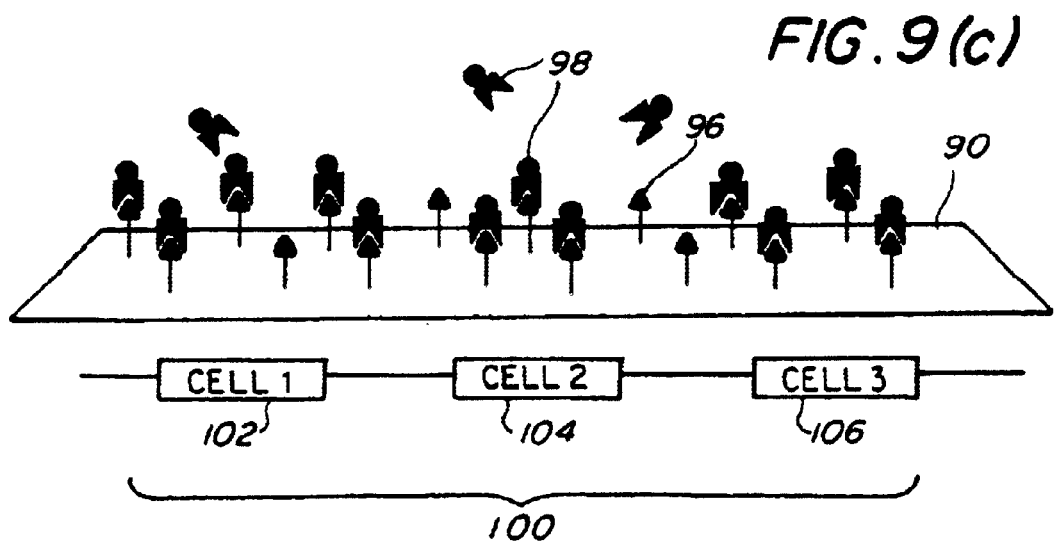
Figure 9D:
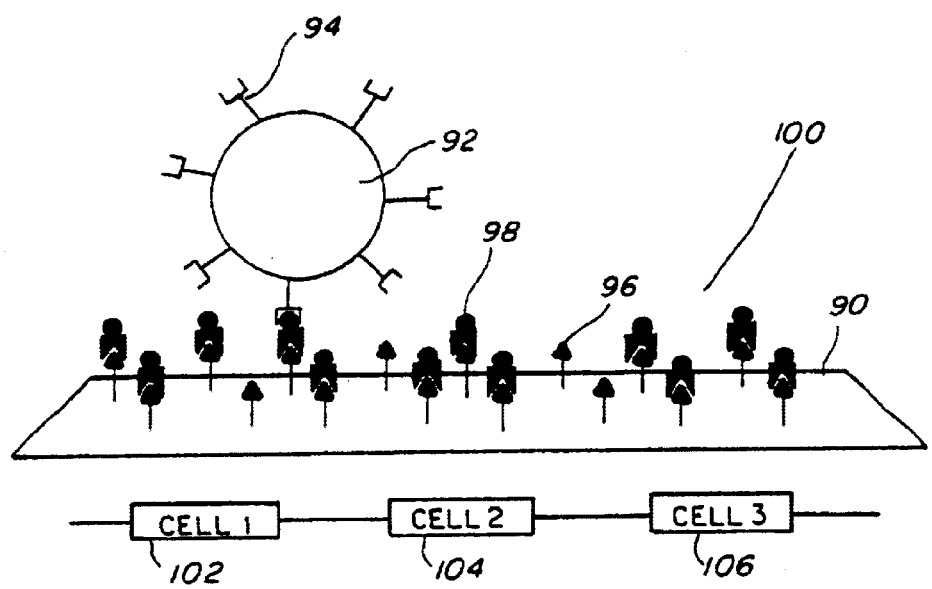
Figure 9E:
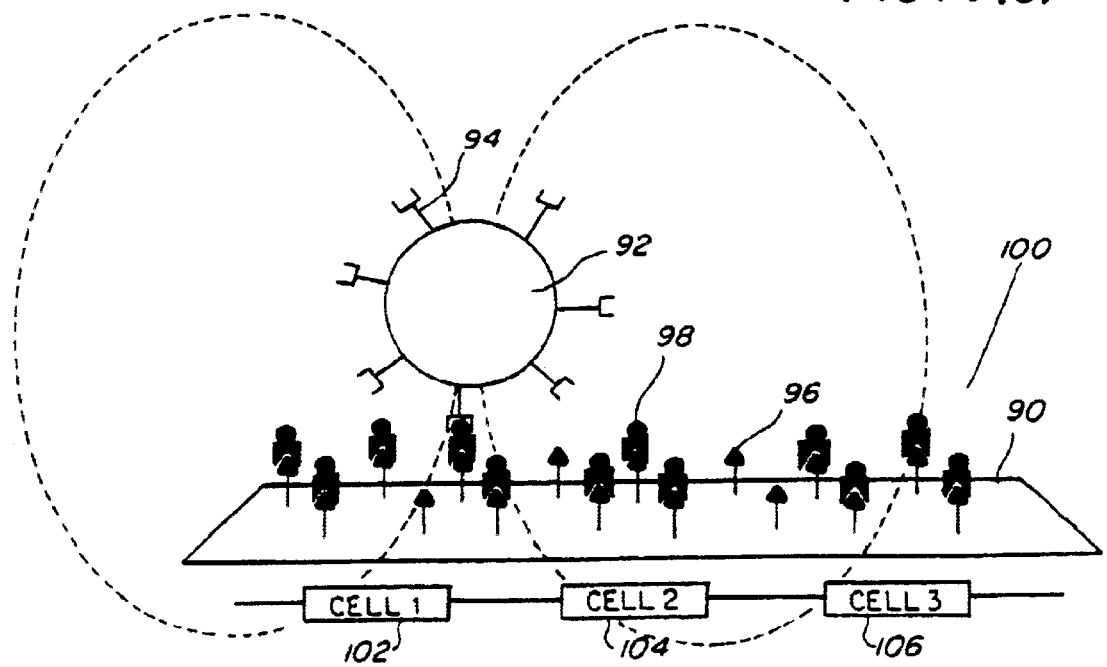

FIGS. 9(a)–(e) depict a different measuring technique that can be used with either of the sandwich assay methods, i.e. either the "tagged particle" or "tagged surface" method. FIGS. 9(a)–(e) depict the latter assay method, but the former assay method is equally valid. In FIG. 9(a) the magnetic particles 92 are functionalized with a first agent 94. In FIG. 9(b), a chip 100 is fabricated with an integrated array (one row or many rows) of Hall effect devices or cells. Each cell 102, 104 and 106 has 1, 2 or 3 sections. The array may be a single row or a plurality of rows. The surface of the chip 100 is functionalized with a second agent 96. In FIG. 9(c), the sample solution is admitted to the surface 90 of the chip 100. If target species 98 are present, they bind to the second functionalizing agent 96. This step is often followed by a rinse. In FIG. 9(d), the solution of magnetic particles is applied to the surface 90. If target species 98 are bound to the surface 90 of the chip 100, the magnetic particles 92 can bind to the targets 98. This step is often followed by a rinse. When magnetic particles 92 bind to a target 98 as shown in FIG. 9(e), an electrical signal (1, 2 or 3 signals for 1, 2 or 3 sections) is recorded (detected and/or measured) for each cell. The presence of a magnetic particle 92 in the vicinity of a given cell 102, 104 or 106 is determined or detected from the readings of the electrical signals. A map of electrical signals of all cells near the chip surface can be made, and the number and location of magnetic particles 92 (and therefore of targets 98) can be inferred, thereby allowing identification of the target chemical or biological material. By contrast with the technique of FIGS. 7(a)–(e) and 8(a)–(e), this technique involves a single measurement from multiple, integrated sensors. In practice, this technique has several benefits. It is less expensive and portable.

Arrays, such as array 60, can be fabricated with many elements, on the order of $1000^2$ to $10,000^2$, with a rapid integrated readout. Thus, the present array of vector magnetometers affords a utilitarian means for mapping tagged molecules. The array 60 can be passivated with a thin protective coating so that the object to be identified can be applied and removed, and the chip can be reused. Alternatively, even if the chip cannot be reused the cost of highly integrated arrays is relatively low. Since the time required for readout is short, e.g., on the order of 10 nanoseconds per cell, the contents of the array 60 can be read and recorded periodically, and the array 60 can be used for studies of motion for appropriate samples.

Figure 6B:
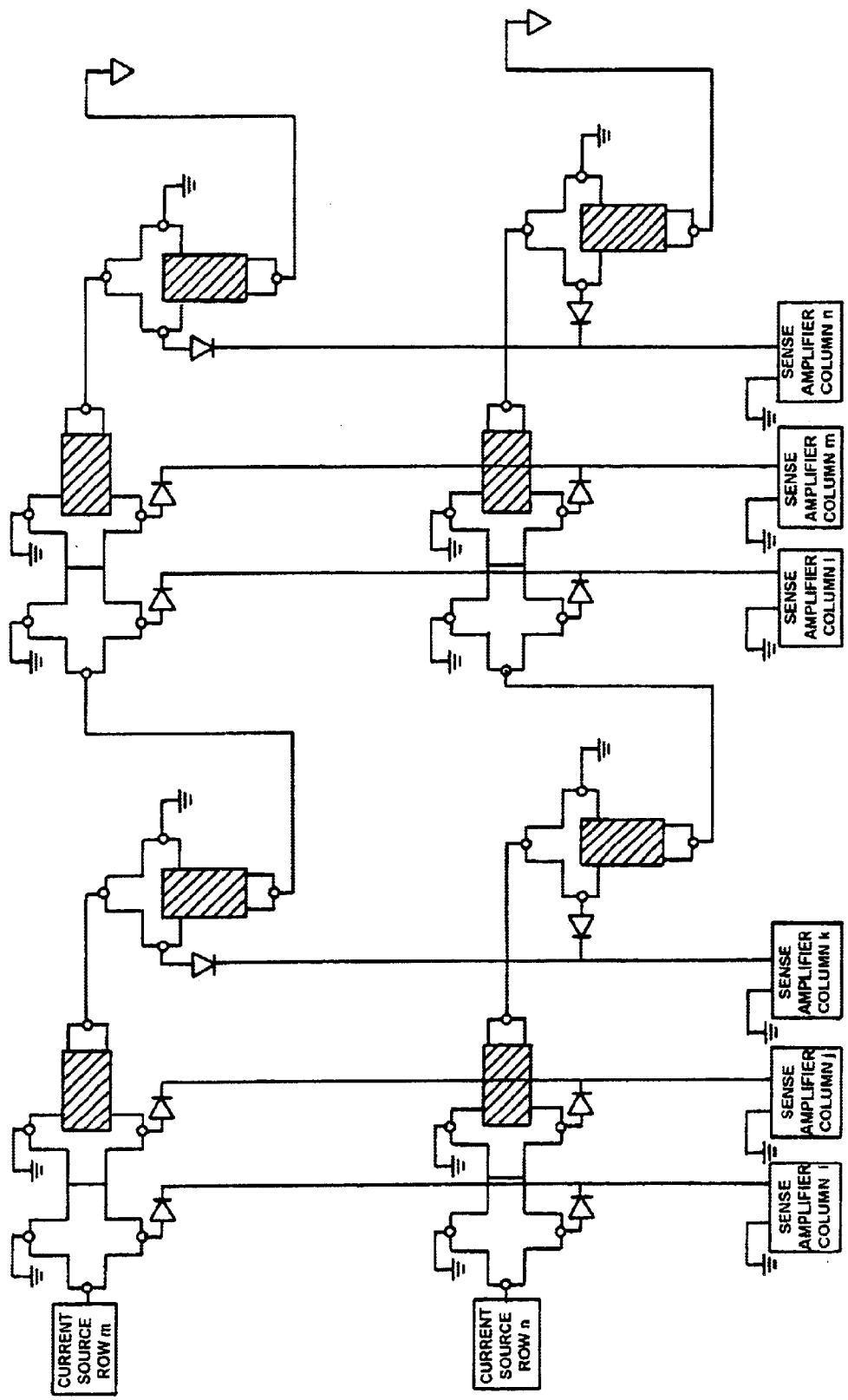
FIG. 6(b) is a plan view of an array of hybrid Hall devices in accordance with the present invention.

While the foregoing discussion of arrays has been made with reference to an example of a cell that measures two vector components, generalization to three vector components (as shown in FIG. 6(b)) is straightforward and will now be apparent to one skilled in the art. Further, there are many examples where measurement of a single component of magnetic field with high spatial resolution is adequate for a given application. In that case, the present invention represents a novel application of a traditional Hall device: the use of a two-dimensional array of Hall sensors, with integrated readout, for scalar field measurements with high spatial resolution.

There are applications where an external perturbing magnetic field can be applied to the object that is the source of magnetic field to be measured. The present vector magnetometer, in any of the embodiments described above, can be used in these applications as a susceptometer, even if the perturbing field is also applied to the sensor.

An example of a susceptometer, which incorporates the present invention, is provided by the use of a vector magnetometer to sense the local field of a microscopic magnetic particle, where the vector magnetometer can be for either a single scanning magnetometer employing a single sensor 20 or an array of devices such as array 60. For some classes of magnetic particles, a small external field develops a magnetic moment in the particle, and the axis of the magnetic dipole may be determined by intrinsic magnetic anisotropies and need not be aligned with the field.

For example, application of a field $H_x \hat{x}$ may result in a dipolar moment with field components along $\hat{z}$ and these components would be detected by Hall sensor 33 of FIGS. 2(a) and 2(b). If the resulting dipole creates fields with components along $\hat{x}$, the response of Hall sensor 32 could be tested for deviations from the linear response to applied field, with such a deviation indicating the presence of a local field.

The present vector magnetometer-incorporating sensor 20 has advantages over previous devices, such as a magnetoresistive (MR) sensor. As previously noted, a magnetoresistive element has sufficient field sensitivity but only over a limited range of field, and it is sensitive to inplane fields. Further, as previously described, a magnetoresistive sensor is insensitive to a $\hat{z}$ component. Thus, a single Hall sensor, such as Hall sensor 33 of device 20, can be adapted for use in measuring components of a magnetic field where MR sensors have no sensitivity, such as the application of in-plane fields that result in dipolar moments with substantial field components along the $\hat{z}$ axis.

Furthermore, the present vector magnetometer can be employed to measure components where conventional MR sensors are ineffective since MR sensors have linear response only over a narrow field range, and MR sensors cannot be used to sense local dipolar field components along the $\hat{x}$ axis for external fields along $\hat{x}$ that exceed a small value. Thus, MR sensors have limited use for susceptometry applied to microscopic magnetic particles. The present hybrid Hall effect vector magnetometer, although it has less field sensitivity than MR sensors, has a much larger dynamic range and has sensitivity to all field components, and is therefore a superior device for this application.

In additional, the present Hall effective devices, when adapted for use as magnetometers, have advantages of scaling as compared with MR sensors. Although both devices can be microfabricated on a small scale, the margins of reproducibility are higher for the present Hall sensors. For example, the present device can be manufactured with dimensions of 300 nm by 300 nm, with highly reproducible characteristics from device to device. Margins and yields are of particular importance in array applications, where thousands or millions of Hall devices may be used.

The present Hall devices may also be integrated with conventional MR sensors to thereby provide additional functionality. As discussed previously, magnetoresistive sensors have higher field sensitivity over a small range of field. There may be environments where higher field sensitivity over a narrow field range is required. Therefore, it may be advantageous to integrate one or more MR sensors with one or more of the present Hall devices to form a hybrid cell.

Although the invention has been described above in relation to preferred embodiments thereof, it will be understood by those skilled in the art that variations and modifications can be effected in these preferred embodiments without departing from the scope and spirit of the invention.

What is claimed is:

1. An integrated Hall effect device for determining vector components of an external magnetic field, said device comprising:

a conductive substrate having a top surface with a first section and a second section for carrying an electrical current, said first section being positioned proximate to said second section such that a first electrical signal is generated in response to one of the vector components of the external magnetic field acting perpendicularly on an electrical current in said conductive substrate;

a ferromagnetic film having at least two configurable magnetization orientation states, and being disposed over a portion of said second section such that a fringe magnetic field generated by vector components of the external magnetic field acting on the magnetization of said ferromagnetic film projects from an edge of said ferromagnetic film that is over a portion of said second section, and such that a second electrical signal is generated in response to the fringe magnetic field acting on an electrical current in said conductive substrate; and a detector for detecting the presence of said first and said second electrical signals.

2. The device of claim 1, said device further comprising a device for measuring a parameter of said first and said second electrical signals.

3. The device of claim 1, wherein said first electrical signal and said second electrical signals are simultaneously analyzed to provide two vector components of said magnetic field.

4. The device of claim 1, wherein said proximity between said first and said second sections is of from about 0 to about 10 mm.

5. The device of claim 1, wherein said conductive substrate and said ferromagnetic film are separated by an insulating layer.

6. The device of claim 1, wherein said conductive substrate comprises a first arm and an opposing second arm, said first arm and said second arm coupled to said first section and defining a first voltage axis.

7. The device of claim 6, wherein said conductive substrate comprises a third arm and an opposing fourth arm, said third arm and said fourth arm coupled to said second section and mutually defining a second voltage axis.

8. The device of claim 7, wherein said conductive substrate comprises a first bias arm and an opposing second bias arm, said first bias arm and said second bias arm defining a first current axis, said first current axis being perpendicular to both said first voltage axis and said second voltage axis.

9. The device of claim 7, wherein said edge of said ferromagnetic film is parallel to said second voltage axis.

10. The device of claim 7, wherein said ferromagnetic film includes a magnetization axis that is substantially parallel to the electrical current and substantially perpendicular to said second voltage axis.

11. The device of claim 7, wherein said first electrical signal is a first bipolar voltage generated along said first voltage axis and said second electrical signal is a second bipolar voltage generated along said second voltage axis.

12. An integrated Hall effect device for determining the vector components from an external magnetic field, said device comprising:

a conductive substrate having a top surface with a first section, a second section and a third section for carrying an electrical current, said first section being positioned in proximity to said second section such that a first electrical signal is generated in response to one of the vector components of the external magnetic field acting perpendicularly on an electrical current in said conductive substrate, said conductive substrate comprising a first arm and an opposing second arm, said first arm and said second arm coupled to said first section and mutually defining a first voltage axis, said conductive substrate comprising a third arm and an opposing fourth arm, said third arm and said fourth arm coupled to said second section and mutually defining a second voltage axis, said conductive substrate comprising a first bias arm and an opposing second bias arm, said first bias arm and said second bias arm mutually defining a first current axis perpendicular to both said first voltage axis and said second voltage axis, said third section being positioned proximate to said second section, said conductive substrate comprising a fifth arm and an opposing sixth arm with said fifth arm and said sixth arm coupled to said third section and mutually defining a third voltage axis, and a third bias arm opposite to a fourth bias arm, said third bias arm and said fourth bias arm mutually defining a second current axis and said second current axis being perpendicular to said third voltage axis;

a first ferromagnetic film having at least two configurable magnetization orientation states, and being disposed over a portion of said second section such that a fringe magnetic field generated by vector components of the external magnetic field acting on the magnetization of said ferromagnetic film projects from an edge of said ferromagnetic film that is over said portion of said second section, and such that a second electrical signal is generated in response to the fringe magnetic field acting on the electrical current in said conductive substrate;

a second ferromagnetic film having at least two configurable magnetization orientation states, and being disposed over a portion of said third section such that a fringe magnetic field generated by vector components of the external magnetic field acting on said second ferromagnetic film projects from an edge of said second ferromagnetic film that is over said portion of said third section, and such that a third electrical signal is generated in response to the fringe magnetic field acting on the electrical current in said conductive substrate; and a detector for detecting the presence of said first, said second, and said third electrical signals.

13. The device of claim 12, said device further comprising a device for measuring a parameter of said first, said second, and said third electrical signals.

14. The device of claim 12, wherein said first electrical signal, said second electrical signal and said third electrical signals are simultaneously analyzed to provide three vector components of said magnetic field.

15. The device of claim 12, wherein said conductive substrate and said ferromagnetic film are separated by an insulating layer.

16. The device of claim 12, wherein said edge of said first ferromagnetic film is parallel to said second voltage axis and said edge of said second ferromagnetic film is parallel to said third voltage axis.

17. The device of claim 12, wherein said first ferromagnetic film includes a magnetization axis that is substantially parallel to the first current axis and substantially perpendicular to said second voltage axis and said second ferromagnetic film includes a magnetization axis that is substantially parallel to the second current axis and substantially perpendicular to said third voltage axis.

18. The device of claim 12, wherein said first electrical signal is a first bipolar voltage generated along said first voltage axis, said second electrical signal is a second bipolar voltage generated along said second voltage axis, and said third electrical signal is a third bipolar voltage generated along said third voltage axis.

* * * * *